IF AMPLIFIER WITH COMPENSATED TRANSISTOR UNIT

Filed Aug. 20, 1968 3 Sheets-Sheet 1

IF AMPLIFIER WITH COMPENSATED TRANSISTOR UNIT

Filed Aug. 20, 1968 3 Sheets-Sheet 3

United States Patent Office 3,560,866

Patented Feb. 2, 1971

3,560,866

IF AMPLIFIER WITH COMPENSATED TRANSISTOR UNIT

George W. Haines, Williamstown, Mass., assignor to Sprague Electric Company, North Adams, Mass., a corporation of Massachusetts Continuation-in-part of application Ser. No. 551,341, May 19, 1966. This application Aug. 20, 1968, Ser. No. 753,940

Int. Cl. H03b *1/14*

U.S. Cl. 330—27 5 Claims

ABSTRACT OF THE DISCLOSURE

An integrated bridge network of two transistor pairs is used as the active device in a tuned differential IF amplifier stage. The transistors are so fabricated and interconnected as to provide neutralization of the internal collector-to-base capacitive feedback. Variations of the relative bias current levels of the transistor pair produce automatic gain control for the stage with minimal frequency response variations.

CROSS REFERENCE TO RELATED APPLICATIONS

This application is a continuation-in-part of U.S. patent application 551,341, filed May 19, 1966, which issued Mar. 31, 1970, as U.S. Letters Patent 3,504,203.

BACKGROUND OF THE INVENTION

A serious problem encountered in the design of band-pass (tuned) transistor amplifiers is the neutralization of the collector-to-base feedback through depletion layer capacitance $C_c$. This capacitive feedback causes coupling of input and output tank circuits and renders especially difficult the alignment of the center frequency and Q of each amplifier stage. Neutralization entails feeding back, from the output, a signal of equal amplitude but of phase opposite to that of the $C_c$ feedback signal. For discrete components, various methods have been developed to achieve this neutralization. In one method a phase reversal is obtained from an interstage transformer or tapped tuned coil. A capacitor, equal in value to $C_c$, connects the inverted signal to the transistor base. This method, besides adding unwanted components to the circuit, requires a close, difficult-to-achieve tolerance in the added capacitor. Another method employs bridge neutralization for differential amplifier applications. This method, besides requiring tight component tolerances, also requires component tracking with bias and temperature since a variation in temperature, power supply or bias current will cause bridge imbalance.

Finally, the various automatic gain control methods are adversely affected by the capacitive feedback. In addition, when using the preferred AGC method of varying DC emitter current, unwanted Y parameter variations occur.

SUMMARY OF THE INVENTION

This invention relates to tuned IF transistor amplifiers of monolithic construction employing external inductors and more particularly, to an individual amplifier stage. This stage includes bridge neutralization means for compensating for internal capacitive feedback, said means comprising the integrated matched transistor pair disclosed in the aforementioned copending application. Depending on their interconnection, one transistor pair acts as the active device while the other pair acts as a capacitive feedback compensator. Because of the monolithic fabrication, the transistor pairs can be constructed identically assuring an exact degree of bridge neutralization and, since the active and passive collector base junctions "see"

the same temperature and quiescent DC voltage, component-tracking with bias and temperature is assured. Each stage can then be independently aligned. The gain itself is maximized because the active device is more nearly unilateral (the reverse transmission of the compensated transistor pair is less than 5% of the value appropriate for uncompensated devices of identical structure).

The stage also includes reverse AGC means which reduces Y parameter variations thereby reducing changes in center frequency and bandwidth.

BRIEF DESCRIPTION OF THE DRAWINGS

A further understanding of the invention can be achieved from a study of the following description and drawing wherein.

DESCRIPTION OF THE INVENTION

Figure 1:
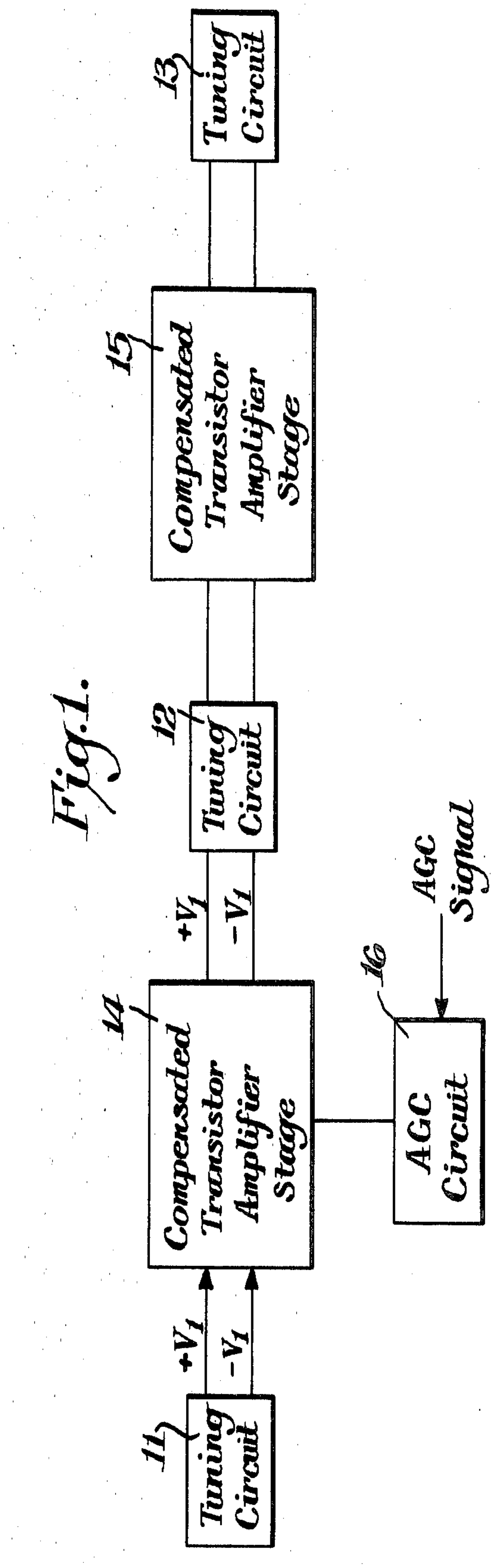
FIG. 1 is a block diagram of a two stage IF amplifier embodying the compensated amplifier and novel AGC circuit.

FIG. 1 shows, in block diagram form, a two stage IF amplifier. External tuned circuits 11, 12 and 13 provide the required selectivity of the stages. Two compensated transistor amplifier stages 14 and 15, and AGC circuit 16 form the single integrated circuit package. The inputs to stage 14 consist of differential signals $+V_1$ and $-V_1$. The requirements for the amplifier would be maximum power gain when operating at the desired bandwidth ($\cong$45 mHz. for purposes of this discussion), ease of alignability between stages and variable gain control with a minimum of Y parameter variation.

The usual method of tuning low frequency IF amplifiers is to roughly tune each stage to a center frequency $f_0$ and then repeat the process with succeeding finer tunings since each tuning affects the preceding ones to some degree. This process does not effect the Q of the circuit, however and the overall bandwidth may be far from desired. The bandwidth is probably most easily adjusted by changing the damping resistors on one or more of the tuned circuits. However, when dealing with more complicated passbands involving high Q tuned circuits, each stage must have its designed center frequency and Q if the desired overall bandshape is to be obtained. But at the higher frequencies, the design values have been upset by internal feedback effects and the above alignment methods become virtually impossible to implement. The compensated transistor amplifier pairs used in stages 14 and 15 eliminate, or neutralize, this internal feedback thereby reducing the alignment problems considerably without sacrificing gain. Their function, and that of the AGC circuit, is explained in the following paragraphs.

Figure 2:
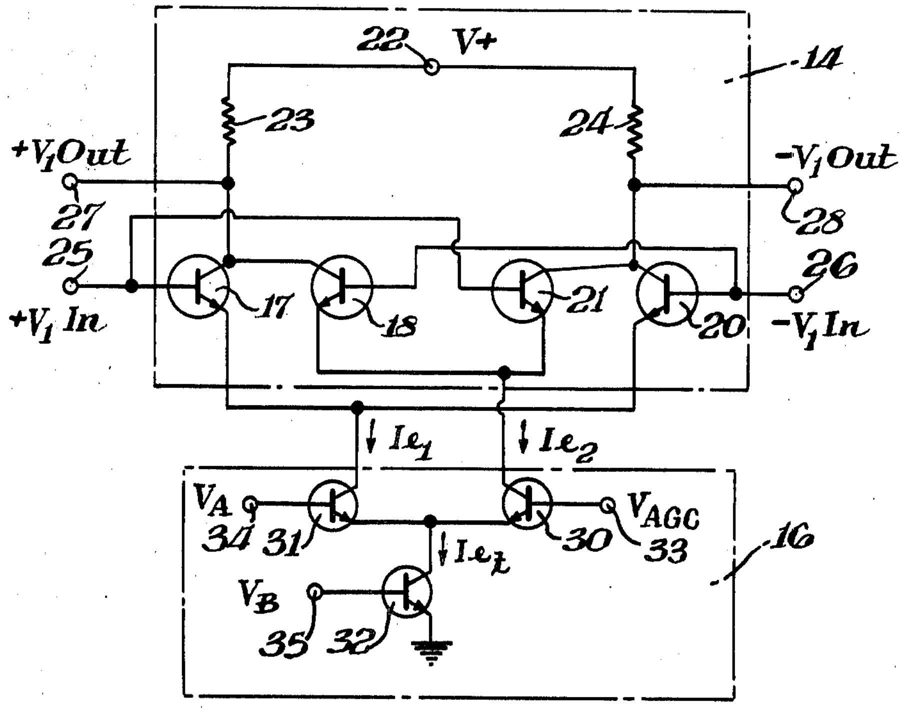
FIG. 2 is a detailed circuit diagram of one of the stages of FIG. 1 and its associated AGC circuit.

Referring to FIG. 2, transistors 17, 18, 20 and 21 are monoltihically formed into an integrated bridge network and comprise stage 14. The base of transistor 17 is connected to the base of transistor 21 whereas its collector is connected to the collector of transistor 18. Similarly, the base and collector of transistor 20 is connected to the base and collector of transistors 18 and 21 respectively. The collectors are biased from voltage supply 22 across load resistors 23 and 24. The differential inputs to the stage are applied across terminals 25 and 26 while the amplified output signals are taken across terminals 27 and 28 (although a single ended output of ($V_{1\,out}$ or $-V_{1\,out}$) could be obtained, if desired).

Differential inputs $+V_1$ and $-V_1$ are applied to differential transistors 17 and 20 respectively, which provide the required amplification. Transistor 21 provides a feedback capacitor by its collector-base junction to compensate the collector-base depletion layer capacitance of transistor 17. Similarly, transistor 18 provides the compensating capacitor for transistor 20. The bridge is exactly balanced since the active and passive collector-base junctions see the same quiescent DC voltage (thereby assuring bias tracking) and both transistor pairs carry a portion of the bias current of the stage. Because of the collector-base neutralization, the reverse transmission through transistors 17 and 20 is greatly reduced and maximum output signal is delivered across terminals 27 and 28.

One method of automatic gain control of stage 14 is to vary the relative bias current levels of transistors 18 and 21 and transistors 17 and 20. This is accomplished by biasing the common-connected emitters of the transistor pairs with a differential current source. Transistors 18 and 21 are biased by current source transistor 30 to produce bias current $Ie_2$ and, similarly, transistors 17 and 20 are biased by current source transistors 31 to produce bias current $Ie_1$. The current source transistors are assumed to be a balanced differential pair and are themselves biased by transistor 32. Transistor 30 is biased by and AGC voltage 33, transistor 31 by voltage source 34 ($V_A$) and transistor 32 by voltage source 35 ($V_B$).

The gain of stage 14, when AGC circuit 16 is included, is proportional to the bias current difference $Ie_1-Ie_2$.

For the condition where no reduction in gain is required, the AGC voltage to transistor 33 will be zero. As this voltage increases, $Ie_2$ will increase, but $Ie_1$ must decrease by the same amount since the total current through transistor 32 must remain the same. Maintaining a constant $Ie_1+Ie_2$ minimizes input and output impedance variations over the full AGC range and, hence, limits the Y parameter variations of the stage. For example, for a 45 mHz. bandwidth and a gain reduction of 40 db, maintaining $Ie_1+Ie_2=10$ ma. results in variations of bias less than 10% in the input admittance ($Y_{11}$) parameters, less than 10% in the Re ($Y_{22}$) and less than 20% in the Im ($Y_{22}$) parameters.

Figure 5:
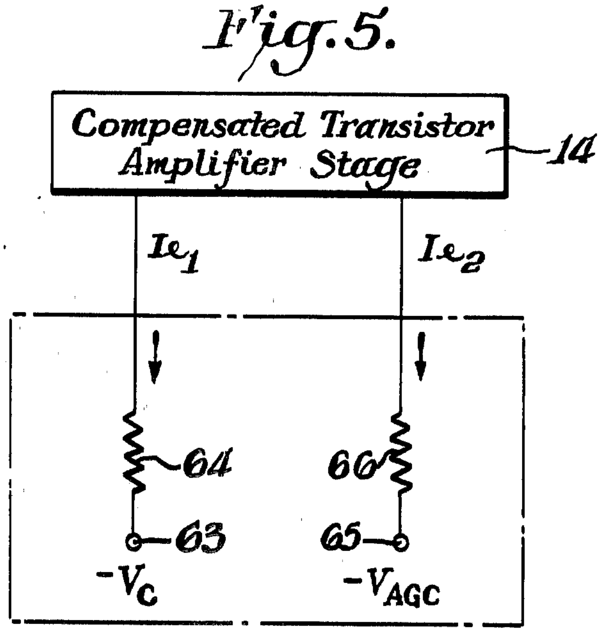
FIG. 5 is an alternate AGC circuit.
Figure 3:
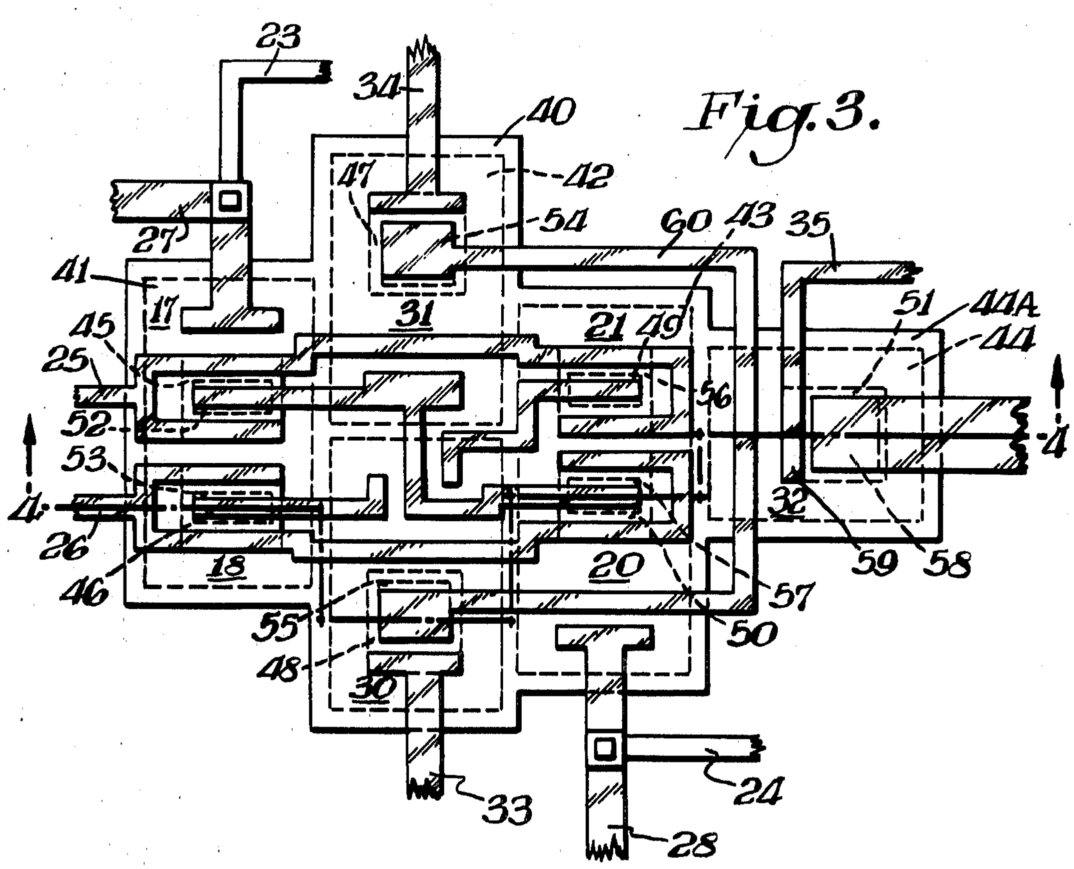
FIG. 3 is the circuit of FIG. 2 formed in a microcircuit chip.
Figure 4:
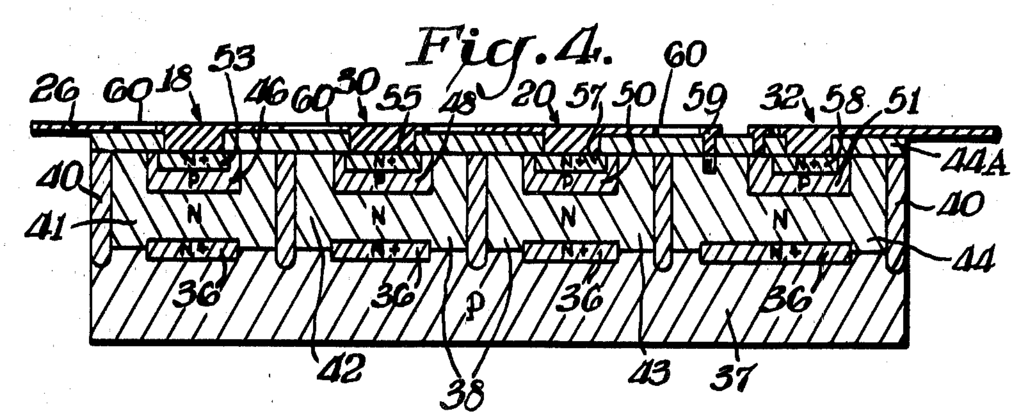
FIG. 4 is a cross-section through line 4—4 of FIG. 3.

FIG. 4 shows a top view of the circuit described above monolithically formed in a silicon chip while FIG. 5 shows a cross-sectional view of the chip. Using standard oxide mask-photolithographic techniques, high-impurity N-type regions 36 are first diffused into the relatively high resistivity P-type substrate 37 under the areas where transistors 17, 18, 20, 21, 30, 31 and 32 are to be formed. An epitaxial layer 38 having an impurity concentration suitable for the collector region of the transistors is then formed over the entire substrate. A deep high-impurity concentration P-type isolation wall 40 is subsequently diffused through epitaxial layer 38 creating electrical isolation pockets 41, 42, 43 and 44. A masking coat 44A of silicon dioxide is formed over the surface of each of the four pockets and contact openings are made to each pocket. P-type base regions 45–51 are then diffused into the pockets. Regions 47, 48 and 51 are diffused into pockets 42 and 44 using standard base-diffusion techniques; paired regions 45, 46 and 49, 50 in pockets 41 and 43 respectively are simultaneously diffused so as to provide two collector-base junctions in each pocket having substantially the same impurity profile and area. Resistors 23 and 24 are formed at the same time as the base regions.

The pocket surfaces are again masked and emitter and interconnect contact openings are made through layer 44A. Thereafter, N-type emitter regions 52–58 are diffused into their respective base regions. A plurality of interconnect contact regions 59 (only one is shown) are also formed to provide high quality ohmic contacts with aluminum interconnect pattern 60. External contacts 25–28 and 33–35 are also formed at this time completing the circuit connections shown in FIG. 2. A sintering cycle at high temperatures completes the aluminum to silicon contacts. The photolithographic and diffusion processes referred to in the above fabrication are found in the fourth edition of "Integrated Circuit Engineering—Basic Technology" by Glen R. Madland et al., Boston Technical Publishers Inc., 1966.

An alternative gain control circuit, shown in FIG. 5, may be used where it is desired to intentionally vary the stage center frequency and Q with decreasing gain level. For example, this circuit would be useful in providing IF response changes for optimal reception of weak-signal TV transmission.

Referring to FIG. 5, bias current $Ie_1$ for transistors 17 and 20 is a fixed value determined by the value of voltage supply 63 ($-V_c$) and resistor 64. The total stage current is now varied by the values of the AGC bias 65 and resistor 66. Parameters $Y_{11}$ and $Y_{22}$ are now controlled by the AGC voltage; these parameters in turn affect the center frequency and the Q of the stage. Hence, either an increase or decrease can be obtained in these values by proper selection of bias voltage and resistors.

While a particular embodiment of the invention has been shown and described, it is not intended that the invention be limited to such disclosure. For example, although high frequency IF amplifier use has been stressed, the invention can also be used at the lower frequencies ($\cong$10 mHz.). At these frequencies, and for high gain amplifiers, the gain-bandwidth is limited by source impedance and collector-base capacitance through Miller effect narrowbanding. By using the compensated transistor pair of this invention, an increase in available gain bandwidth of five times is observed at a bandwidth of 10 mHz. Also, for application versatility, the role of the transistor pairs could be interchanged without affecting the circuit function.

What is claimed is:

1. An amplifier having at least one compensated transistor amplifier stage comprising a bridge network of two substantially identical pairs of transistors, one transistor of each of said pairs connected in said network as an amplifier transistor, the other transistor of each of said pairs connected in said network as a compensating transistor neutralizing the internal depletion layer capacitive feedback of the amplifier transistor of that pair, the emitters of the two amplifier transistors being connected in common and the emitters of the two compensating transistors being connected in common, and an automatic gain control means connected to said network commonly biasing the emitters of said two pairs of transistors and controlling the difference between respective emitter currents.

2. An amplifier according to claim 1 wherein the base of a first transistor amplifier is connected to the base of a first compensating transistor, the collector of said first transistor amplifier is connected to the collector of a second compensating transistor, the base of the second transistor amplifier is connected to the base of said second compensating transistor, the collector of said second transistor amplifier is connected to collector of said first compensating transistor and whereby the collector-base capacitance of said first amplifier transistor is neutralized by said first compensating transistor and the collector-base capacitance of said second amplifier is neutralized by said second compensating transistor.

3. An amplifier according to claim 1 wherein said biasing means comprises a differential amplifier pair, the base of the first differential amplifier being biased by a fixed voltage and its collector connected to the commonly-connected transistor amplifier emitters while the base of the second differential amplifier is biased by an AGC voltage and its collector is connected to the commonly-connected compensating transistor emitters, and a transistor current source biased by a fixed voltage at its base and whose collector is connected to a common point connecting the emitter of the differential pair and whose emitter is connected to ground and whereby, while the difference of the currents through the differential pair will change upon change of said AGC voltage, the total current through said current source transistor will remain constant and will reduce the input and output parameter variations.

4. An amplifier according to claim 1 wherein said biasing means comprises a resistor connected between the commonly-connected transistor amplifier emitters and a fixed negative bias voltage and another resistor connected between commonly-connected compensating transistors and an AGC voltage supply whereby, as the AGC voltage varies, the gain, center frequency and Q of the stage can be made to increase or decrease as desired by selecting appropriate values of said resistors and voltage.

5. An amplifier according to claim 3 wherein the components comprising said amplifier are formed in a semiconductor body comprising:

a high resistivity P-type semiconducting substrate;

first regions of high impurity concentration N-type of semiconductivity in p-n junction forming relation with the surface of said substrate;

an epitaxial layer of N-type of semiconductivity extending over the surface of said substrate and covering said first regions, said layer also acting as a transistor collector region;

a high impurity concentration region of P-type of semiconductivity diffused through said epitaxial layer so as to create a plurality of electrical isolation pockets around and between said first regions;

an oxide layer extending over the surface of said epitaxial layer and having a plurality of contact windows formed thereon;

second base regions of P-type of semiconductivity diffused into the epitaxial layer above said first regions and in p-n junction forming relation with said epitaxial layer, two pairs of said second regions being simultaneously diffused in separate electrical isolation pockets so as to provide two collector-base junctions in each pocket having substantially the same impurity profile and area;

additional second regions of P-type of semiconductivity diffused into, and in p-n junction forming relation with, the epitaxial layer to form resistive elements;

third emitter regions of N-type of semiconductivity diffused into, and in p-n junction forming relation with, said second base regions whereby said first, second and third regions and the portions of the epitaxial layer between said first and second regions cooperate to form a plurality of transistors having a collector, emitter, and base and whereby the one pair of said transistors having said simultaneously diffused base region comprise said first transistor amplifier and second compensating transistor, the second pair of said transistors comprise said second transistor amplifier and said first compensating transistor, and whereby said differential amplifier transistor pair is formed in one of said electrical isolation pockets and said transistor current source in a separate isolation pocket;

a plurality of N-type contact regions diffused into said epitaxial layer;

a plurality of terminal contact areas; and a metallic interconnect pattern on the surface of said amplifier connecting said transistors, resistors and terminals as described in the aforementioned claim.

References Cited

UNITED STATES PATENTS

| | | | |
|---|---|---|---|
| 3,036,275 | 5/1962 | Harmer | 330—29 |
| 3,141,137 | 7/1964 | Greutman | 330—29 |
| 3,383,610 | 5/1968 | Kedson | 330—27X |
| 3,444,472 | 5/1969 | Johnson | 330—30X |
| 3,452,289 | 6/1969 | Ryan | 330—30X |

ROY LAKE, Primary Examiner

J. B. MULLINS, Assistant Examiner

U.S. Cl. X.R.

330—29, 30, 38